United States Patent
Tomasini et al.

(10) Patent No.: US 6,542,034 B2
(45) Date of Patent: Apr. 1, 2003

(54) OPERATIONAL AMPLIFIER WITH HIGH GAIN AND SYMMETRICAL OUTPUT-CURRENT CAPABILITY

(75) Inventors: Luciano Tomasini, Milan (IT); Giancarlo Clerici, Milan (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/778,677

(22) Filed: Feb. 7, 2001

(65) Prior Publication Data

US 2001/0026194 A1 Oct. 4, 2001

(30) Foreign Application Priority Data

Feb. 9, 2000 (EP) .............................. 00830091

(51) Int. Cl.[7] .............................. H03F 3/18; H03F 3/45; H03F 3/26
(52) U.S. Cl. .................. 330/264; 330/255; 330/267
(58) Field of Search .......................... 330/255, 264, 330/267

(56) References Cited

U.S. PATENT DOCUMENTS

| | | | |
|---|---|---|---|
| 5,471,170 A | * 11/1995 | Genest | 330/151 |
| 5,670,910 A | 9/1997 | Kato | 330/253 |
| 5,900,783 A | 5/1999 | Dasgupta | 330/264 |
| 5,955,908 A | * 9/1999 | Tam | 327/108 |
| 6,057,734 A | * 5/2000 | Xu | 330/253 |
| 6,300,836 B1 | * 10/2001 | Belyi | 330/257 |

OTHER PUBLICATIONS

Itakura Et Al. "10 μA Quiescent Current Opamp Design for LCD Driver ICs" IDICE Transactions on Fundamentals of Electronics, Communications and Computer Sciences, JP, Institute of Electronics Information and Comm. Tokyo, vol. E81, No. 2, Feb. 1, 1998, pp. 230–236, XP000773921.*

* cited by examiner

Primary Examiner—Patricia T. Nguyen
(74) Attorney, Agent, or Firm—Allen, Dyer, Doppelt, Milbrath & Gilchrist, P.A.; Lisa K. Jorgenson

(57) ABSTRACT

An operational amplifier includes a first stage, and a second stage with an input connected to an output of the first stage and an output connected to a load. The second stage includes between its input and its output a first signal path for driving the load in a first direction, and a second signal path for driving the load in the opposite direction. The first and second signal paths have substantially equal gains for small signals, substantially equal output impedances for small and large signals, and substantially equal output-current capabilities.

23 Claims, 1 Drawing Sheet

OPERATIONAL AMPLIFIER WITH HIGH GAIN AND SYMMETRICAL OUTPUT-CURRENT CAPABILITY

FIELD OF THE INVENTION

The present invention relates to electronics and, more particularly, to an operational amplifier.

BACKGROUND OF THE INVENTION

Operational amplifiers are used in various applications in analog electronics. An operational amplifier is a circuit characterized by having two inputs, that is, an inverting or negative input and a non-inverting or positive input. The operational amplifier includes an output, that is, a single-ended amplifier, or two outputs, that is, a double-ended amplifier which is also known as a fully differential amplifier.

Theoretically, an operational amplifier has infinite differential input impedance. In practice, operational amplifiers have a very high differential input impedance. Theoretically, operational amplifiers have an infinite gain voltage-driven output voltage. In practice, however, operational amplifiers have a very high gain. Theoretically, operational amplifiers also have an infinite output-current capability which is also symmetrical in the two cases of a leading edge and of a trailing edge of the output signal, and an infinite rate of variation (slew rate) of the output current over time.

Operational amplifiers which are symmetrical from the point of view of their output-current capabilities but which have a single amplification stage and, hence low overall gain, are readily known by one skilled in the art. Other known operational amplifiers include two amplification stages in cascade, and thus have a sufficiently high overall gain. However, these operational amplifiers are not symmetrical with regard to their output-current capabilities.

Operational amplifiers with more than two stages are critical from a stability point of view. In fact, it is known that operational amplifiers are normally used with a feedback network between the input and the output. To ensure the stability of the feedback loop in which the operational amplifier is connected, it is necessary to provide compensation capacitors within the amplifier. This increases the area occupied by the amplifier and reduces the slew rate.

SUMMARY OF THE INVENTION

In view of the foregoing background, an object of the present invention is to provide an operational amplifier with sufficiently high gain which is not critical from the stability point of view, and which at the same time is symmetrical with respect to its output-current capability.

According to the present invention, this object is achieved by an operational amplifier comprising a first stage, and a second stage with an input connected to an output of the first stage and an output connected to a load. The second stage comprises, between its input and its output, a first signal path for driving the load in a first direction and a second signal path for driving the load in the opposite direction. The first and second signal paths have substantially equal gains for small signals, substantially equal output impedances for small and large signals, and substantially equal output-current capabilities.

BRIEF DESCRIPTION OF THE DRAWINGS

The characteristics and the advantages of the present invention will be made clearer by the following detailed description of a possible practical embodiment thereof, shown purely by way of a non-limiting example, in the single drawing given on the appended drawing sheet.

DETAILED DESCRIPTION OF THE PREFERRED EMBODIMENTS

Figure 1:
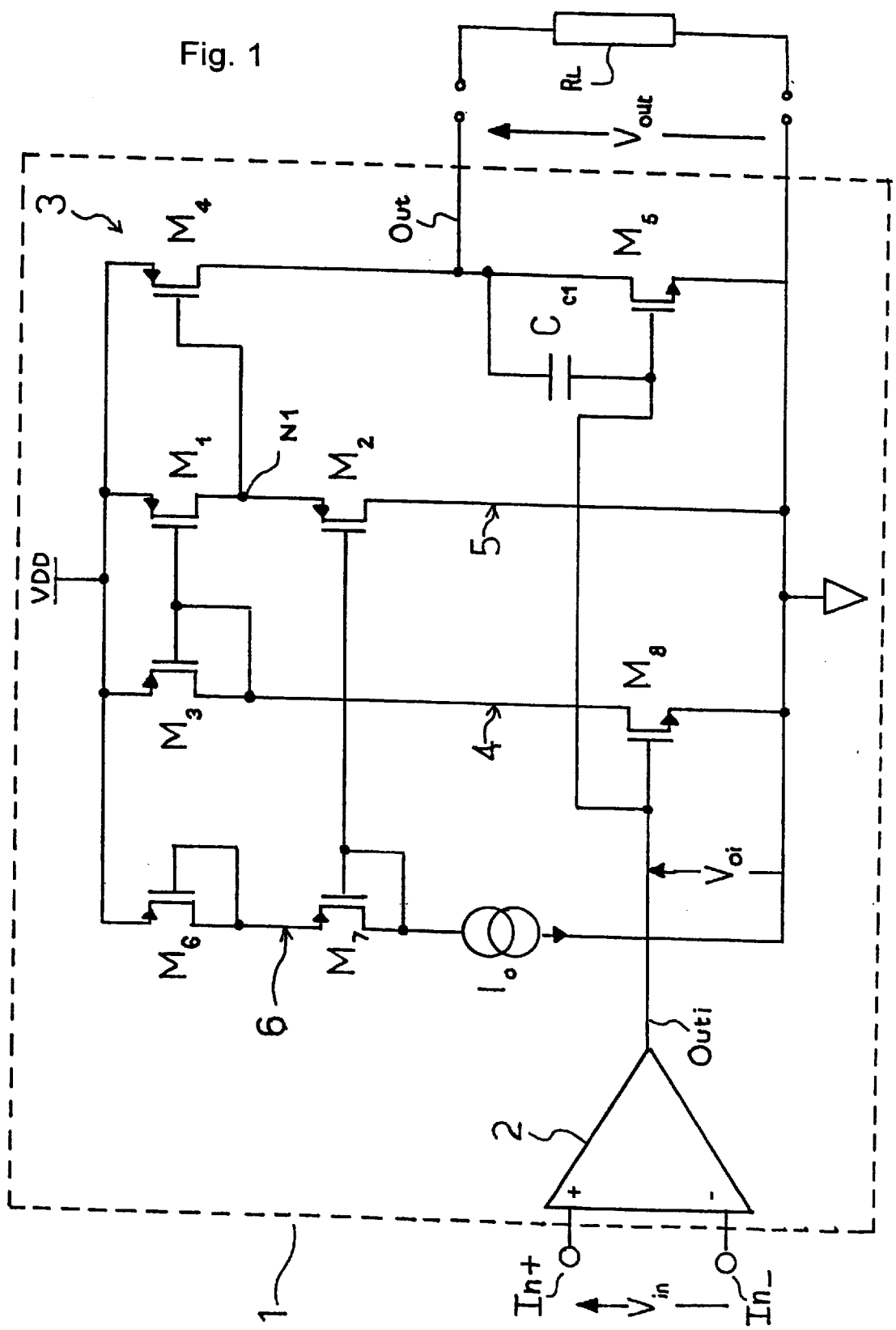
FIG. 1 shows the circuit diagram of an operational amplifier according to the present invention.

The operational amplifier, generally indicated by 1, comprises a first amplification stage 2 or input stage. The first amplification stage 2 has two inputs, that is, a positive or non-inverting input In+ and a negative or inverting input In−, between which an input signal $V_{in}$ can be applied. The first single-ended amplification stage 2 has an output $Out_i$. The output $Out_i$ of the first amplification stage 2 is supplied to a second amplification stage, generally indicated by 3.

The second amplification stage 3 comprises a final stage $M_4$, $M_5$ which forms a Class B push-pull output stage. The output stage is formed by a p-channel MOSFET $M_4$ and an n-channel MOSFET $M_5$ connected in series between a supply voltage VDD and a reference voltage. The reference voltage is ground in the embodiment shown. In particular, the MOSFET $M_4$ has its source electrode connected to the supply voltage and its drain electrode connected to the drain electrode of the MOSFET $M_5$ the source electrode of which is connected to ground. The common node between the MOSFETs $M_4$ and $M_5$ forms an output Out of the operational amplifier.

The second amplification stage 3 comprises two signal paths. A first signal path or n-path is formed by the path which goes from the output $Out_i$ of the first amplification stage 1 to the output Out of the operational amplifier passing through the n-channel MOSFET $M_5$ of the final stage. A second signal path or p-path is formed by the path which goes from the output $Out_i$ of the first amplification stage 1 to the output Out of the operational amplifier passing through the p-channel MOSFET $M_4$ of the final stage. The first signal path or n-path serves for driving the load RL in a first direction, particularly towards ground. The second signal path or p-path serves for driving the load in the opposite direction, in particular, towards the supply voltage VDD.

The n-channel MOSFET $M_5$ has its gate electrode connected to the output $Out_i$ of the first amplification stage 2. The MOSFET $M_5$ of the output stage is therefore driven directly by the output $Out_i$ of the first amplification stage 2. A compensation capacitor $C_{c1}$ is also connected between the gate electrode and the drain electrode of the MOSFET $M_5$.

For driving the p-channel MOSFET $M_4$, however, the second stage 3 comprises a pair of circuit branches 4, 5. The branch 4 comprises a p-channel MOSFET $M_3$ and an n-channel MOSFET $M_8$ connected in series between the supply voltage VDD and ground. The MOSFET $M_3$ is connected in a diode configuration, that is, it has its gate electrode short-circuited to its drain electrode. The MOSFET MS has its gate electrode connected to the output $Out_i$, that is, it is driven by the first amplification stage 2.

The branch 5 comprises two p-channel MOSFETs $M_1$ and $M_2$ connected in series between the supply voltage VDD and ground. The MOSFET $M_1$, which has its source electrode connected to the supply voltage VDD, has its gate electrode connected to the gate electrode of the MOSFET $M_3$. The drain electrode of the MOSFET $M_1$, which is also the source electrode of the MOSFET $M_2$, is connected to the gate electrode of the MOSFET $M_4$ of the final stage.

As a result of the way in which the MOSFETs $M_3$ and $M_1$ are connected to one another, the two circuit branches 4 and 5 form a current mirror. This current mirror also acts substantially as a level translator for the MOSFET $M_4$.

The operational amplifier 1 also comprises a biasing circuit for the MOSFET $M_2$. The biasing circuit comprises a circuit branch 6 with a pair of p-channel MOSFETs $M_6$, $M_7$ connected as diodes and connected in series between the supply voltage VDD and a current generator $I_O$. In practice, the current generator $I_O$ may also be formed by transistors in accordance with one of the known approaches, so that the current $I_o$ has a value which is substantially constant with variations in the supply voltage VDD with a high output impedance.

The dimensions of the MOSFETs $M_1$, $M_2$, $M_3$, $M_4$, $M_5$ and $M_8$ of the second amplification stage 3 may be selected in accordance with the following considerations. First of all, the n-channel MOSFET $M_5$ of the final stage will have to be relatively highly conductive so as to be able to absorb a relatively high current from the load.

If the ratio between the transconductance $g_{mN5}$ of the n-channel $M_5$ of the final stage and the transconductance $g_{nM8}$ of the n-channel MOSFET $M_8$ is K, that is:

$$g_{mN5}/g_{mN8}=K,$$

the dimensions of the remaining MOSFETs $M_1$, $M_2$, $M_3$, and $M_4$ of the second stage will be such that their transconductances $g_{mP1}$, $g_{mP2}$, $g_{mP3}$ and $g_{mP4}$ satisfy the equation:

$$(g_{mP1}/g_{mP3})*(g_{mP4}/g_{mP2})=K.$$

As readily understood by one skilled in the art, this can easily be achieved by the W/L ratios (where W and L are the channel width and length of the MOSFET, respectively) of the individual MOSFETs.

Preferably, since the p-channel MOSFET $M_4$ in the final stage will have to have dimensions to be relatively highly conductive so as to be able to supply a relatively high current to the load, and the ratio between the transconductance $g_{mP1}$ of the MOSFET $M_1$ and the transconductance $g_{mP3}$ of the MOSFET $M_3$ of the current mirror will have to be kept as close as possible to unity in order not to reduce excessively the pass-band of the current mirror for a small signal, the two p-channel MOSFETs $M_3$ and $M_1$ of the current mirror have dimensions such that the ratio between their transconductances is substantially equal to 1 (mirroring ratio equal to approximately 1). The p-channel MOSFET $M_4$ of the final stage and the p-channel MOSFET $M_2$ have dimensions such that the former has a transconductance value approximately K times greater than the transconductance of the MOSFET $M_2$. The MOSFETs $M_6$, $M_7$ of the biasing circuit 6 preferably have dimensions such that the ratio between their transconductance values and the transconductance of the MOSFETs $M_1$, $M_2$, $M_3$ is substantially equal to 1.

The operational amplifier described operates in the following manner. The biasing circuit 6 sets the operating voltage at the gate of the MOSFET $M_2$ at a value such that the current which flows in the final stage 3 at rest, that is, in the absence of a signal $V_{in}$ at the input of the operational amplifier 1, is approximately equal to K times the current $I_O$. As explained above, K is the ratio between the transconductance $g_{mP4}$ of the p-channel MOSFET $M_4$ and the transconductance $g_{mP2}$ of the p-channel MOSFET $M_2$.

It is important to note that, in the second signal path or p-path, the node N1 connected to the gate of the p-channel MOSFET $M_4$ of the final stage is a low-impedance node. This node is in fact connected to the source electrode of the p-channel MOSFET $M_2$ which is itself a low-impedance node. Moreover, since the drain of the MOSFET $M_2$ is connected to ground, the impedance seen by the node N2 is further reduced. By virtue of the fact that the node N1 has low impedance, it is not necessary to provide for its compensation.

It is assumed that a load of impedance equal to RL is applied to the output Out of the operational amplifier 1 and a low-frequency (voltage) signal $V_{in}$ is applied between the inputs In+ and In−. It is also assumed that the first amplification stage 2 has a gain of A1, so that the signal $V_{oi}$ which is present at the output $Out_i$ of the first amplification stage 2 is $$V_{oi}=V_{in}*A1$$

The first signal path or n-path will be considered. If $g_{mN5}$ is the transconductance of the MOSFET $M_5$, $$V_{out}=-V_{oi}*g_{mN5}*RL.$$

The gain in absolute value of the second amplification stage 3 along the n-path is therefore:

$$A2=(V_{out}/V_{oi})=g_{mN5}*RL$$

and the overall gain of the operational amplifier along the n-path is:

$$A=A1*A2=A1*g_{mN5}*RL.$$

The second signal path or p-path will now be considered. Assuming that $g_{mN8}$, $g_{mP3}$, $g_{mP1}$, $g_{mP2}$ and $g_{mP4}$ are the respective transconductances of the MOSFETs $M_8$, $M_3$, $M_1$, $M_2$ and $M_4$, in this case:

$$V_{out}=V_{oi}*g_{mN8}*(g_{mP1}/g_{mP3})*(g_{mP4}/g_{mP2})*RL$$

With the dimensions of the MOSFETs described above:

$$(g_{mP1}/g_{mP3})=1$$

and $$(g_{mP4}/g_{mP2})=K$$

Therefore, for the p-path:

$$V_{out}=V_{oi}*g_{mN8}*K*RL$$

but, again on the basis of the dimensions of the MOSFETs described above, $$g_{mN8}K*=g_{mN5}$$

the gain A2 of the second amplification stage 3 along the p-path is equal to the gain of the second amplification stage 3 along the n-path.

The operational amplifier 1 therefore has perfect symmetry between the p-path and the n-path, since the gain along the two paths is equal, except for mismatch between the components. However, any asymmetry resulting from mismatch between the components would certainly be of a lower order than asymmetry resulting from different circuit topology in the p-path and the n-path.

Clearly, variations and/or additions to the embodiment described and illustrated above may be provided. For example, although in the embodiment shown and described reference was made to MOS field-effect transistors, naturally this should not be considered a limitation of the invention since transistors of other types may in fact also be used.

Although the dimensions of the transistors given in the embodiment described are preferred, these are in no way limiting. An expert in the art can easily design alternative dimensions for the transistors without the resulting circuit thereby being considered not to be included within the scope of the protection of the present invention defined in the appended claims.

Moreover, the voltage for biasing the MOSFET M2 which, in the embodiment described, is generated by a biasing circuit 6 forming part of the operational amplifier, may be generated external the operational amplifier by a biasing circuit. For example, the biasing circuit may be similar to the biasing circuit described, which may even be common to several operational amplifiers.

That which is claimed is:

1. An operational amplifier for driving a load and comprising:
   a first stage; and
   a second stage including an input connected to an output of said first stage and an output connected to the load, said second stage comprising between the input and output thereof
      a first signal path for driving the load in a first direction,
      a first load transistor in the first signal path and being driven by the output of said first stage,
      a second signal path for driving the load in an opposite direction,
      a second load transistor connected to said first load transistor and in the second signal path for driving the load in the second direction,
      said first and second signal paths have substantially equal gains for low level signals, substantially equal output impedances for low and high level signals, and substantially equal output-current capabilities, and
      a signal-level translation circuit connected to the output of said first stage for driving said second load transistor, said signal-level translation circuit comprising
         first and second circuit branches connected as a current mirror,
         said first circuit branch comprising a first translation transistor comprising a control terminal connected to the output of said first stage and being driven by the output, and a second translation transistor connected in series with said first translation transistor and being configured as a diode, and
         said second circuit branch comprising a third translation transistor comprising a control terminal connected to a control terminal of said second translation transistor, and a fourth translation transistor connected in series with said third translation transistor, a common node between said third and fourth translation transistors defining a low-impedance output node.

2. An operational amplifier according to claim 1, wherein said second load transistor comprises a control terminal connected to the low-impedance output node.

3. An operational amplifier according to claim 1, further comprising a biasing circuit for biasing said fourth translation transistor.

4. An operational amplifier according to claim 1, wherein a transconductance ratio between said second load transistor and said fourth translation transistor, multiplied by a transconductance ratio between said third translation transistor and said second translation transistor is substantially equal to a transconductance ratio between said first load transistor and said first translation transistor.

5. An operational amplifier according to claim 1, wherein dimensions of said second translation transistor and said third translation transistor are such that a transconductance ratio therebetween is equal to 1; and wherein dimensions of said fourth translation transistor is such that a transconductance ratio between said second load transistor and said fourth translation transistor is substantially equal to a transconductance ratio between said first load transistor and said first translation transistor.

6. An operational amplifier according to claim 1, wherein said first and second load transistors and said first through fourth translation transistors each comprises a MOSFET.

7. An operational amplifier according to claim 1, wherein said first load transistor and said first translation transistor each comprises an n-channel MOSFET, and wherein said second load transistor and said second through fourth translation transistors each comprises a p-channel MOSFET.

8. An operational amplifier for driving a load and comprising:
   a first stage; and
   a second stage having an input connected to an output of said first stage and an output connected to the load, said second stage comprising
      a first signal path comprising a first load transistor for driving the load in a first direction and comprising a control terminal connected to the output of said first stage, and
      a second signal path comprising a second load transistor for driving the load in an opposite direction;
      said first and second signal paths have substantially equal gains for low level signals, substantially equal output impedances for low and high level signals, and substantially equal output-current capabilities,
      a signal-level translation circuit connected to the output of said first stage for driving said second load transistor, said signal-level translation circuit comprising first and second circuit branches connected as a current mirror,
         said first circuit branch comprising a first translation transistor comprising a control terminal connected to the output of said first stage and being driven by the output, and a second translation transistor connected in series with said first translation transistor and being configured as a diode, and
         said second circuit branch comprising a third translation transistor comprising a control terminal connected to a control terminal of said second translation transistor, and a fourth translation transistor connected in series with said third translation transistor, a common node between said third and fourth translation transistors defining a low-impedance output node.

9. An operational amplifier according to claim 8, further comprising a biasing circuit for biasing said fourth translation transistor.

10. An operational amplifier according to claim 8, wherein a transconductance ratio between said second load transistor and said fourth translation transistor, multiplied by a transconductance ratio between said third translation transistor and said second translation transistor is substantially equal to a transconductance ratio between said first load transistor and said first translation transistor.

11. An operational amplifier according to claim 8, wherein dimensions of said second translation transistor and said third translation transistor are such that a transconductance ratio therebetween is equal to 1; and wherein dimensions of said fourth translation transistor is such that a transconductance ratio between said second load transistor and said fourth translation transistor is substantially equal to a transconductance ratio between said first load transistor and said first translation transistor.

12. An operational amplifier according to claim 8, wherein said first load transistor and said first translation transistor each comprises an n-channel MOSFET, and wherein said second load transistor and said second through fourth translation transistors each comprises a p-channel MOSFET.

13. An operational amplifier for driving a load and comprising:
- a first stage; and
- a second stage having an input connected to an output of said first stage and an output connected to the load, said second stage comprising
  - a first signal path for driving the load in a first direction,
  - a second signal path for driving the load in an opposite direction, and
  - a signal-level translation circuit comprising first and second circuit branches connected as a current mirror,
    - said first circuit branch comprising a first translation transistor being driven by the output of said first stage, and a second translation transistor connected in series with said first translation transistor, and
    - said second circuit branch comprising a third translation transistor comprising a control terminal connected to a control terminal of said second translation transistor, and a fourth translation transistor connected in series with said third translation transistor,
  - said first translation transistor comprising an n-channel MOSFET, and said second through fourth translation transistors each comprising a p-channel MOSFET.

14. An operational amplifier according to claim 13, wherein said first translation transistor is configured as a diode.

15. An operational amplifier according to claim 13, wherein said first and second signal paths have substantially equal gains for low level signals, substantially equal output impedances for low and high level signals, and substantially equal output-current capabilities.

16. An operational amplifier according to claim 13, wherein said second stage further comprises:
- a first load transistor in the first signal path for driving the load in the first direction; and
- a second load transistor connected to said first load transistor and in the second signal path for driving the load in the second direction.

17. An operational amplifier according to claim 13, wherein said signal-level translation circuit includes a low-impedance output node; and wherein said second load transistor comprises a control terminal connected to the low-impedance output node.

18. An operational amplifier according to claim 13, further comprising a biasing circuit for biasing said fourth translation transistor.

19. An operational amplifier according to claim 13, wherein a transconductance ratio between said second load transistor and said fourth translation transistor, multiplied by a transconductance ratio between said third translation transistor and said second translation transistor is substantially equal to a transconductance ratio between said first load transistor and said first translation transistor.

20. An operational amplifier according to claim 13, wherein dimensions of said second translation transistor and said third translation transistor are such that a transconductance ratio therebetween is equal to 1; and wherein dimensions of said fourth translation transistor is such that a transconductance ratio between said second load transistor and said fourth translation transistor is substantially equal to a transconductance ratio between said first load transistor and said first translation transistor.

21. An operational amplifier according to claim 16, wherein said first load transistor comprises an n-channel MOSFET, and wherein said second load transistor comprises a p-channel MOSFET.

22. A method for driving a load using an operational amplifier comprising a first stage, and a second stage including an input connected to an output of the first stage and an output connected to the load, the second stage comprising a signal-level translation circuit comprising first and second circuit branches connected as a current mirror, the method comprising:
- driving the load in a first direction via a first signal path by driving a first load transistor in the first signal path via the output of the first stage;
- driving the load in an opposite direction via a second signal path by driving a second load transistor connected to the first load transistor and being in the second signal path, the second load transistor being driven by the output of the first stage via the signal-level translation circuit;
- the first and second signal paths having substantially equal gains for low level signals, substantially equal output impedances for low and high level signals, and substantially equal output-current capabilities; and
- driving a first translation transistor in the first circuit branch by the output of the first stage with a second translation transistor being connected in series with the first translation transistor and being configured as a diode, the first translation transistor comprising a control terminal connected to the output of the first stage, and with the second circuit branch comprising a third translation transistor comprising a control terminal connected a control terminal of the second translation transistor, and a fourth translation transistor being connected in series with the third translation transistor.

23. A method according to claim 22, wherein the first load transistor and the first translation transistor each comprises an n-channel MOSFET, and wherein the second load transistor and the second through fourth translation transistors each comprises a p-channel MOSFET.

* * * * *